US011056527B2

(12) United States Patent
Cao et al.

(10) Patent No.: US 11,056,527 B2
(45) Date of Patent: Jul. 6, 2021

(54) METAL OXIDE INTERFACE PASSIVATION FOR PHOTON COUNTING DEVICES

(71) Applicant: General Electric Company, Schenectady, NY (US)

(72) Inventors: Jinbo Cao, Rexford, NY (US); Jongwoo Choi, Niskayuna, NY (US); Aharon Yakimov, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 473 days.

(21) Appl. No.: 15/145,825

(22) Filed: May 4, 2016

(65) Prior Publication Data

US 2017/0323922 A1 Nov. 9, 2017

(51) Int. Cl.
| | |
|---|---|
| *H01L 27/146* | (2006.01) |
| *H01L 31/0216* | (2014.01) |
| *H01L 31/115* | (2006.01) |
| *G01T 1/24* | (2006.01) |
| *H01L 31/0224* | (2006.01) |

(52) U.S. Cl.
CPC .......... *H01L 27/14659* (2013.01); *G01T 1/24* (2013.01); *H01L 27/1462* (2013.01); *H01L 27/14685* (2013.01); *H01L 27/14696* (2013.01); *H01L 27/14698* (2013.01); *H01L 31/0224* (2013.01); *H01L 31/02161* (2013.01); *H01L 31/115* (2013.01)

(58) Field of Classification Search
CPC ......... H01L 27/14659; H01L 27/14676; H01L 31/085; H01L 31/115–119; G01T 1/24
See application file for complete search history.

(56) References Cited

U.S. PATENT DOCUMENTS

| | | | | |
|---|---|---|---|---|
| 5,563,421 | A | * | 10/1996 | Lee .......................... G01T 1/24 250/370.09 |
| 5,686,733 | A | * | 11/1997 | Fallone ................. A61N 5/1049 250/370.09 |
| 5,780,322 | A | * | 7/1998 | Tamamura ............. B82Y 20/00 257/E21.462 |
| 5,886,353 | A | | 3/1999 | Spivey et al. |
| 6,168,967 | B1 | | 1/2001 | Hoffbauer et al. |
| 7,955,992 | B2 | | 6/2011 | Chen et al. |
| 8,263,336 | B2 | | 9/2012 | Rothberg et al. |
| 8,314,395 | B2 | | 11/2012 | Zhang et al. |
| 8,680,637 | B2 | | 3/2014 | Hoenk et al. |
| 9,147,582 | B2 | | 9/2015 | Cao et al. |
| 9,153,729 | B2 | | 10/2015 | Kim et al. |
| 2004/0221807 | A1 | * | 11/2004 | Verghese ................ B82Y 30/00 118/715 |

(Continued)

OTHER PUBLICATIONS

Wu et al., "Characteriziation of CZTSSe photovoltaic device with an atomic layer-deposited passivation layer", Appl. Phys. Lett., vol. 105, 2014, pp. 042108-1-042108-4.*

(Continued)

*Primary Examiner* — Stephen W Smoot
*Assistant Examiner* — Sun Mi Kim King
(74) *Attorney, Agent, or Firm* — Fletcher Yoder, P.C.

(57) ABSTRACT

Described herein are photon counting devices comprising direct mode detectors with improved signal to noise ratios which are suitable for use in X-ray imaging devices, and other imaging devices.

16 Claims, 3 Drawing Sheets

(56) References Cited

U.S. PATENT DOCUMENTS

| | | | |
|---|---|---|---|
| 2008/0203514 A1* | 8/2008 | Szeles | H01L 27/14658 257/442 |
| 2008/0245967 A1* | 10/2008 | van Asselt | G01T 1/2928 250/370.09 |
| 2013/0109124 A1 | 5/2013 | Peng et al. | |
| 2015/0014627 A1* | 1/2015 | Yu | H01L 27/14665 257/13 |

OTHER PUBLICATIONS

Wenbin et al., "A novel surface passivation process for CdZnTe detector packaging", Proceeding of HDP '04, 2004, pp. 377-379.*

Chattopadhyay et al., "Surface passivation of cadmium zinc telluride radiation detectors by potassium hydroxide solution", Journal of Electronic Materials, vol. 29, Issue: 6, pp. 708-712, Jun. 2000.

Swaminathan et al., "Ultrathin ALD—Al2O3 layers for Ge(001) gate stacks: Local composition evolution and dielectric properties", Journal of Applied Physics, vol. 110, Issue: 9, 2011.

\* cited by examiner

METAL OXIDE INTERFACE PASSIVATION FOR PHOTON COUNTING DEVICES

BACKGROUND

The invention relates generally to detectors used in photon counting devices.

A semiconductor radiation detector may be used to detect photons for medical imaging systems. In devices based on direct detection, the photon counting device typically comprises a direct-conversion type semiconductor made of cadmium telluride (CdTe), cadmium zinc telluride (CdZnTe), or the like. Photons of ionizing radiation, e.g., X-ray or gamma ray radiation, are absorbed by the semiconductor of the detector and generate measurable electric signals; there is no need to convert the X-rays into visible light with a scintillator, i.e., the detector is a direct mode detector.

X-rays or gamma rays interact with atoms in the semiconductor to create electron/hole pairs. In order to facilitate the electron/hole collection process in the detector, a +500 volt potential is applied. This voltage is too high for operation at room temperature, as it will cause excessive leakage, and eventually a breakdown. Typically, the detector in the X-ray imaging apparatus is cooled, thereby reducing leakage current and permitting the high bias voltage.

Typically, in CZT-based radiation detectors, the surface of the photoconductive semiconductor layer is passivated by wet etching (e.g., by bromoethanol) to remove the mechanical damage from the surfaces introduced in previous fabrication steps where the semiconductor wafers of the detectors have been sliced and polished followed by oxidation (e.g., surface treatment with an oxidizing agent such as hydrogen peroxide or oxygen plasma). The oxidation process results in formation of cadmium or tellurium oxide layers on the surface of the semiconductor. While such cadmium or tellurium oxide layers can block some leakage current at high bias, and thus reduce noise in the signal readout, there is a need in the field for better passivation of the semiconductor surface to reduce leakage current and/or noise in the signal readout. Further, the oxidation process does not provide much control over the thickness of the passivating layer. The uniformity and/or thickness of the passivating layer affect the electronic noise detected in the signal read out. There is a need in the field for improving the signal to noise ratio of X-ray detectors.

BRIEF DESCRIPTION

Described herein are direct mode detectors with improved signal to noise ratios which are suitable for use in X-ray imaging devices, and other imaging devices.

In one aspect, provided herein is a photon counting device comprising:
  a detector comprising;
    a Group II-VI semiconductor layer located between a cathode electrode and an anode electrode; and
    a metal oxide layer wherein the metal oxide is selected from the group consisting of aluminum oxide ($Al_2O_3$), gallium oxide ($Ga_2O_3$), hafnium oxide ($HfO_2$), zirconium oxide ($ZrO_2$), magnesium oxide (MgO) and combinations thereof.

Also provided herein is a method for fabricating a detector comprising a Group II-VI semiconductor layer, the method comprising depositing a metal oxide layer between the cathode electrode and the semiconductor layer of the X-ray detector, wherein the metal oxide is selected from the group consisting of $Al_2O_3$, $Ga_2O_3$, $HfO_2$, $ZrO_2$, MgO and combinations thereof.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Described herein are methods for reducing leakage current in photon counting devices, e.g., direct mode X-ray detectors. Though the discussion focuses primarily on detectors for measurement of X-ray flux levels or energy levels in a medical imaging context, non-medical applications such as security and screening systems and non-destructive detection systems are well within the scope of the present technique. Further the detector structure and arrangement may be used in, or in conjunction with, computed tomography systems, and in other systems, such as other radiography systems, tomosynthesis systems, mammography systems, C-arm angiography systems and so forth.

Figure 1:
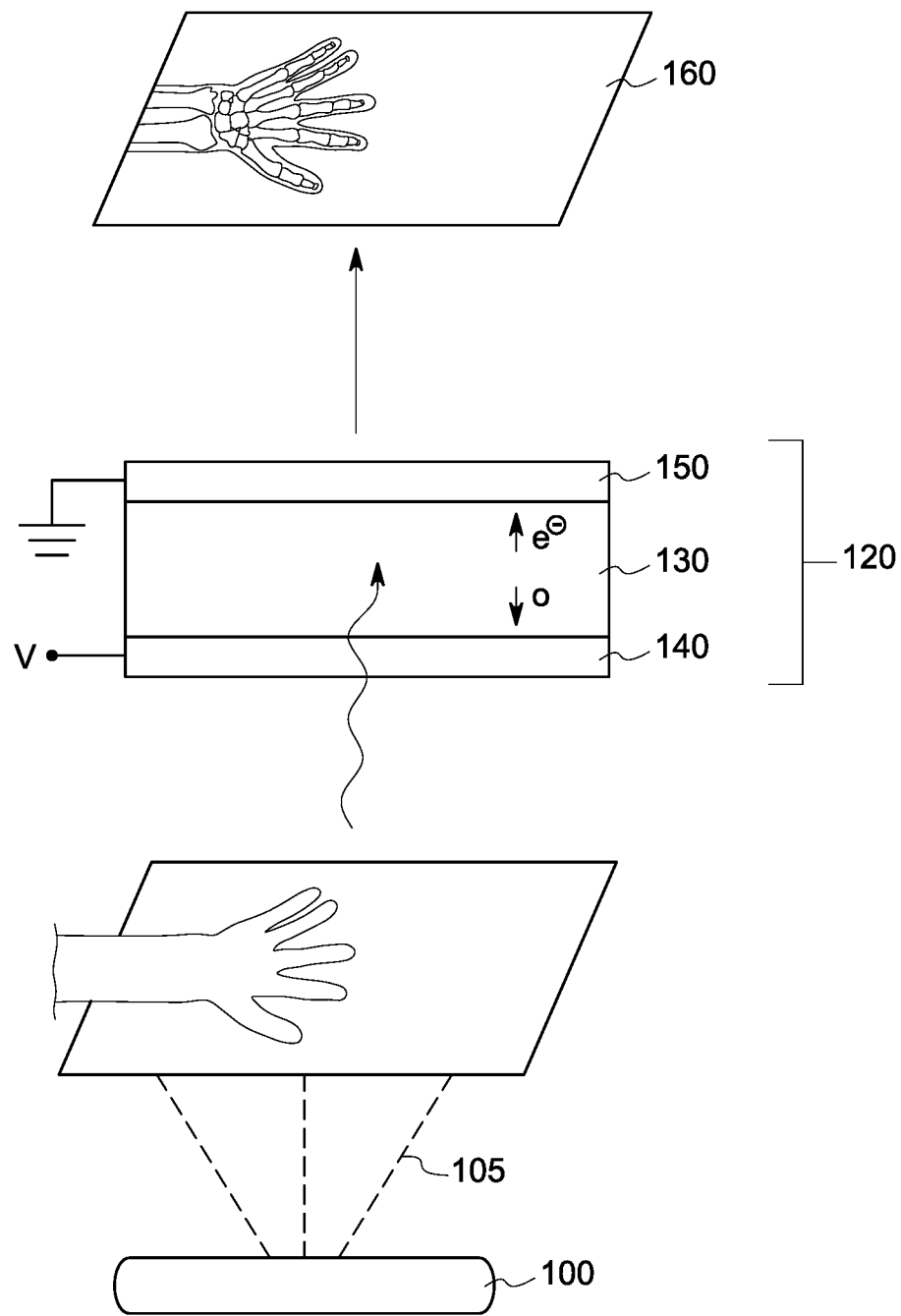
FIG. 1 shows a schematic representation of an example of a photon counting device, an X-ray imaging device.

FIG. 1 describes a typical set up for a photon counting device, specifically, an X-ray imaging medical device. An X-ray source 100 generates radiation 105 which passes through an object 110 and is received on the detector 120 which comprises a semiconductor 130, a cathode 140, and an anode 150. The resulting current is converted to an image 160.

Figure 2:
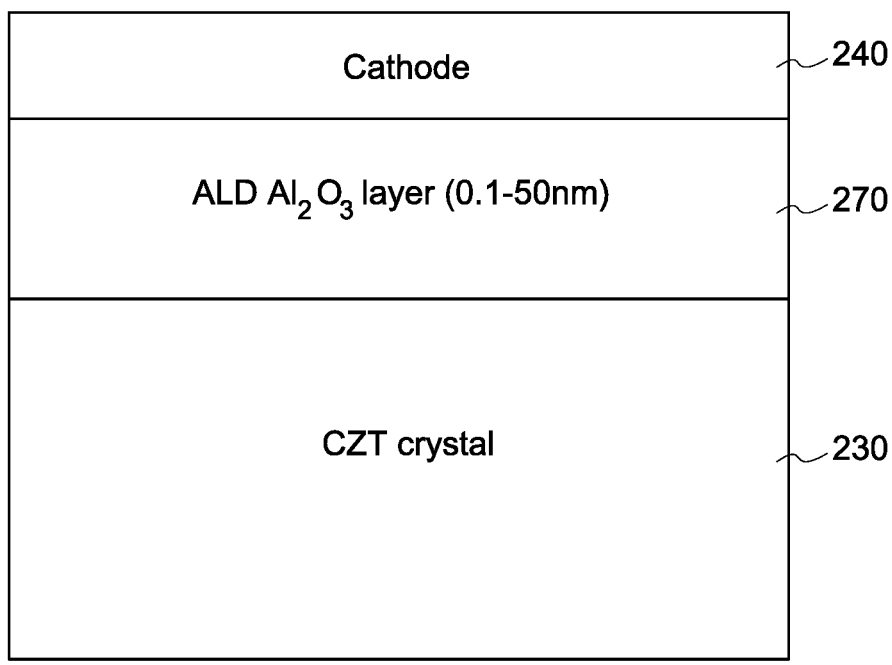
FIG. 2 shows a schematic representation of a semiconductor with a metal oxide passivation interface.

FIG. 2 shows a schematic representation of a portion of a detector 220 with a semiconductor 230 and a passivating interface metal oxide 270 and the cathode 240.

Figure 3:
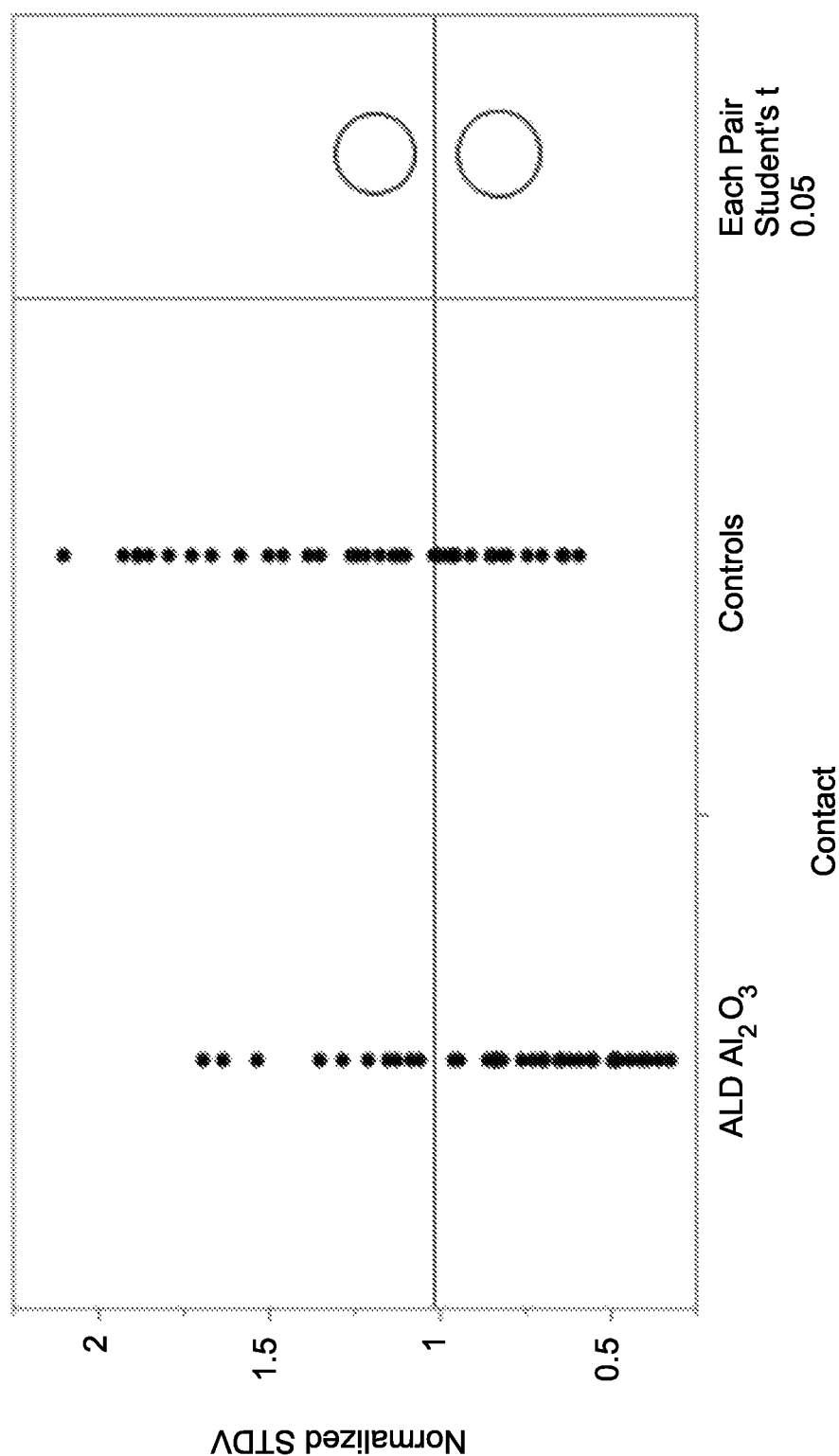
FIG. 3 shows a comparison of measured electronic noise between devices comprising semiconductor metal oxide passivation (Control) and $Al_2O_3$ passivation.

Previously described methods for passivation of semiconductors comprise formation of oxide layers comprising the same metals which are present in the semiconductor (i.e., oxide layers). The use of oxide layers comprising the same metals as the metals in the semiconductor has been preferred because there is minimal disruption of the crystal structure in the semiconductor. By contrast, described herein is passivation of Group II-VI semiconductors wherein the interface passivating metal oxide layer comprises metal oxides selected from metals other than the metals present in the semiconductor layer. As shown in FIG. 3, it was found that interface passivation with metal oxides comprising metals which are different from metals in the semiconductor provided improved signal to noise ratios compared to passivation with oxides comprising metals which are the same as metals in the semiconductor (Control in FIG. 3).

Accordingly, provided herein are Group II-VI semiconductor based radiation detectors (e.g., CZT-based radiation detectors) which comprise interface metal oxide passivation layers where the passivation layer comprises oxides of aluminum, gallium, magnesium, hafnium or zirconium. In some embodiments, the interface passivation layers are deposited via atomic layer deposition thereby allowing for growth/deposition of thin films uniformly and with high precision and allowing for control of the thickness of the layers. Further, the oxides of certain elements (e.g., aluminum) are denser compared to the cadmium or tellurium oxides which are typically formed from oxidation of CZT based crystals, thereby allowing for improved passivation, or, in other words, more efficient blocking of leakage current at high bias. Advantageously, atomic layer deposition of such metal oxides (e.g., aluminum oxide or magnesium oxide) allows for use of thinner passivation layers compared to the layer thickness of passivation layers formed by wet etching or other oxidation processes, thereby enabling scaling down of microelectronics in X-ray imaging devices. Also contemplated within the scope of embodiments presented herein are passivation layers (comprising metal oxides having metals different from the metals in the semiconductor) which are placed on pre-existing oxide-surfaced semiconductors where the pre-existing oxide comprises metals which are the same as the metals present in the semiconductor.

As used herein, in one embodiment, "leakage current" refers to current induced by incidence of non-X-ray radiation on the detector. "Non-X-ray radiation" in this context means visible light, UV radiation, IR radiation, and/or any other ambient radiation which is known by one of skill in the art to contribute towards leakage current in X-ray detectors.

As used herein, where a layer comprising a metal oxide located between the cathode electrode and the Group II-VI semiconductor layer "reduces passage" of the leakage current, in one embodiment, the layer substantially blocks passage of the leakage current while remaining permeable to X-ray radiation induced current. In another embodiment, where a layer comprising a metal oxide located between the cathode electrode and the Group II-VI semiconductor layer "reduces passage" of leakage current, the layer allows passage of only about 20%, about 30%, about 40% or about 50% of the leakage current, while remaining permeable to X-ray radiation induced current. As used herein, where a layer comprising a metal oxide located between the cathode electrode and the Group II-VI semiconductor layer "reduces electronic noise in the signal readout" and/or "improves signal to noise ratio", in one embodiment, the layer substantially blocks electronic noise from fluctuations/distortions in the electrical signal while remaining permeable to the induced current of interest. In another embodiment, where a layer comprising a metal oxide located between the cathode electrode and the Group II-VI semiconductor layer "reduces electronic noise in the signal readout and/or "improves signal to noise ratio", the layer allows passage of only about 20%, about 30%, about 40% or about 50% of the electronic noise, while remaining permeable to the induced current of interest.

The embodiments described herein are not limited to X-ray imaging devices and are also applicable to other imaging devices comprising other sources of radiation such as sources of gamma rays, radioactive material (e.g., radiotracers used in PET scanning) and the like. In such embodiments, leakage current refers to current induced by incidence of radiation other than the radiation of interest produced by the radiation source present in the device and/or dark current, i.e. leakage current without irradiation. In such embodiments, a layer comprising a metal oxide located between the cathode electrode and the photoconductive semiconductor layer reduces passage of leakage current induced by incidence of radiation other than the radiation of interest produced by the radiation source present in the device. In certain instances the passivation layer reduces electronic noise in the signal readout, i.e., reduces noise in the signal readout which was caused by random fluctuations in the input signal.

In one aspect, provided herein is a photon counting device comprising:
a detector comprising;
a Group II-VI semiconductor layer located between a cathode electrode and an anode electrode; and
a metal oxide layer wherein the metal oxide is selected from the group consisting of aluminum oxide ($Al_2O_3$), gallium oxide ($Ga_2O_3$), hafnium oxide ($HfO_2$), zirconium oxide ($ZrO_2$), magnesium oxide (MgO) and combinations thereof.

In one embodiment, the metal oxide layer is located between the cathode electrode and the Group II-VI semiconductor layer. In another embodiment, the metal oxide layer is located between the anode electrode and the Group II-VI semiconductor layer.

In some embodiments, the metal oxide layer comprises $Al_2O_3$ or MgO, or combinations thereof. In other embodiments, the metal oxide layer comprises $Al_2O_3$. In such embodiments, the metal oxide layer is deposited by atomic layer deposition.

In one group of embodiments, the thickness of the metal oxide layer ranges from about 0.1 nm to about 3 nm. In another group of embodiments, the thickness of the metal oxide layer ranges from about 0.1 nm to about 5 nm. In a further group of embodiments, the thickness of the metal oxide layer ranges from about 0.1 nm to about 50 nm. In one embodiment, the metal oxide layer reduces passage of leakage current. In another embodiment, the metal oxide layer reduces electronic noise in the signal readout.

In some embodiments, a photon counting device described herein comprises a Group II-VI semiconductor having Formula I:

$$A\,Te_yZ_{(1-y)} \qquad\qquad I;$$

wherein
A is Cd, Zn, Hg, Mg, or Mn, or a combination thereof;
Z is O, S or Se, or a combination thereof; and
y ranges from 0 to 1.

In certain embodiments, the ratio of [A] to [$Te_yZ_{(1-y)}$] is about 1:1. In such embodiments, Z may be absent in some embodiments (i.e., y=1). Where Z is present, Z is any of: O alone, S alone, Se alone, O and S, Se and O, S and Se, or S, O and Se. In various embodiments, A is any of: one of Cd, Zn, Hg, Mg, or Mn; any two of Cd, Zn, Hg, Mg or Mn; any three of Cd, Zn, Hg, Mg, or Mn; or any other combination of Cd, Zn, Hg, Mg, or Mn.

In some embodiments of Formula I, the Group II-VI semiconductor has Formula II:

$$Cd_xA^1_{(1-x)}Te_yZ_{(1-y)} \qquad\qquad II;$$

wherein
$A^1$ is Zn, Hg, Mg, or Mn, or a combination thereof;
Z is O, S or Se, or a combination thereof;
x ranges from 0 to 1
and
y ranges from 0 to 1.

In certain embodiments, the Group II-VI semiconductor layer comprises CdTe, CdZnTe, CdZnTeSe, CdZnTeSeS, CdZnTeSeO, CdZnTeSeSO, CdTeSe, CdTeSSe, HgCdTe, HgZnTe, CdZnMgTe or combinations thereof. Also contemplated within the scope of embodiments described herein are Group II-VI semiconductor layers comprising CdHgMnTeZ, CdHgZnZ, MnCdTeZ, and the like. In a specific embodiment, the Group II-VI semiconductor is a CdZnTe (CZT) semiconductor. In such embodiments, the CZT has a Formula III: $Cd_xZn_{(1-x)}Te$ where x is as defined above. In one embodiment, the photon counting device comprises a Group II-VI semiconductor which is a CZT semiconductor and the metal oxide is $Al_2O_3$. Described within the scope of embodiments presented herein are photon counting devices in which the Group II-VI semiconductor is already surface-oxidized, followed by deposition of a metal oxide layer wherein the metal oxide is selected from the group consisting of aluminum oxide ($Al_2O_3$), gallium oxide ($Ga_2O_3$), hafnium oxide ($HfO_2$), zirconium oxide ($ZrO_2$), magnesium oxide (MgO) and combinations thereof.

Also provided herein is an X-ray imaging device comprising a detector comprising a Group II-VI semiconductor layer located between a cathode electrode and an anode electrode; and a metal oxide layer wherein the metal oxide is selected from the group consisting of aluminum oxide ($Al_2O_3$), gallium oxide ($Ga_2O_3$), hafnium oxide ($HfO_2$), zirconium oxide ($ZrO_2$), magnesium oxide (MgO) and combinations thereof.

Described herein is a method for fabricating a detector comprising a Group II-VI semiconductor layer, the method comprising depositing a metal oxide layer between the cathode electrode and the semiconductor layer of the X-ray detector, wherein the metal oxide is selected from the group consisting of $Al_2O_3$, $Ga_2O_3$, $HfO_2$, $ZrO_2$, MgO and combinations thereof.

In some embodiments of the method, the metal oxide layer comprises $Al_2O_3$ or MgO or combinations thereof. In other embodiments of the method, the metal oxide layer comprises $Al_2O_3$. In such embodiments, the metal oxide layer is deposited by atomic layer deposition.

In one group of embodiments, the thickness of the metal oxide layer ranges from about 0.1 nm to about 3 nm. In another group of embodiments, the thickness of the metal oxide layer ranges from about 0.1 nm to about 5 nm. In a further group of embodiments, the thickness of the metal oxide layer ranges from about 0.1 nm to about 50 nm. In some embodiments of the method, the metal oxide layer reduces passage of leakage current.

In some embodiments of the method, the Group II-VI semiconductor has Formula I:

$$A\,Te_yZ_{(1-y)} \qquad\qquad I;$$

wherein
A is Cd, Zn, Hg, Mg, or Mn, or a combination thereof;
Z is O, S or Se, or a combination thereof; and
y ranges from 0 to 1.

In certain embodiments, the ratio of [A] to $[Te_yZ_{(1-y)}]$ is about 1:1. In such embodiments, Z may be absent in some embodiments (i.e., y=1). Where Z is present, Z is any of: O alone, S alone, Se alone, O and S, Se and O, S and Se, or S, O and Se. In various embodiments, A is any of: one of Cd, Zn, Hg, Mg, or Mn; any two of Cd, Zn, Hg, Mg or Mn; any three of Cd, Zn, Hg, Mg, or Mn; or any other combination of Cd, Zn, Hg, Mg, or Mn.

In some embodiments of the method, the Group II-VI semiconductor has Formula II:

$$Cd_xA^1_{(1-x)}Te_yZ_{(1-y)} \qquad\qquad II;$$

wherein
$A^1$ is Zn, Hg, Mg, or Mn, or a combination thereof;
Z is O, S or Se, or a combination thereof;
x ranges from 0 to 1
and
y ranges from 0 to 1.

In certain embodiments of the method, the Group II-VI semiconductor layer comprises CdTe, CdZnTe, CdZnTeSe, CdZnTeSeS, CdZnTeSeO, CdZnTeSeSO, CdTeSe, CdTeSSe, HgCdTe, HgZnTe, CdZnMgTe or combinations thereof. Also contemplated within the scope of embodiments described herein are Group II-VI semiconductor layers comprising CdHgMnTeZ, CdHgZnZ, MnCdTeZ, and the like. In a specific embodiment of the method, the Group II-VI semiconductor is a CdZnTe (CZT) semiconductor. In such embodiments, the CZT has a Formula III: $Cd_xZn_{(1-x)}Te$ where x is as defined above. In some embodiments of the method, the Group II-VI semiconductor is a CZT semiconductor and the metal oxide is $Al_2O_3$.

One or more radiation detectors formed in accordance with various embodiments described herein may be used to image an object, such as a human individual, another living creature besides a human individual, or inanimate objects, such as, but not limited to, luggage, shipping containers, and/or the like. However, in other embodiments, no image is generated or formatted and other data is acquired by the radiation detectors, such as spectral response data.

Group II-VI semiconductors include, and are not limited to, II-VI ternary alloy semiconductors comprising cadmium zinc telluride (CdZnTe, CZT), mercury cadmium telluride (HgCdTe), mercury zinc telluride (HgZnTe) and the like. Also contemplated are II-VI semiconductors comprising Cadmium selenide (CdSe), Cadmium sulfide (CdS), Cadmium telluride (CdTe), Zinc selenide (ZnSe), Zinc sulfide (ZnS), Zinc telluride (ZnTe) and combinations thereof.

Cadmium zinc telluride, (CdZnTe) or CZT, is an alloy of cadmium telluride and zinc telluride. It is used in radiation detectors, photorefractive gratings, electro-optic modulators, and solar cells. HgCdTe or mercury cadmium telluride (also cadmium mercury telluride, MCT or CMT) is an alloy of CdTe and HgTe. The amount of cadmium (Cd) in the alloy can be chosen to tune the optical absorption of the material to a desired infrared wavelength. Mercury zinc telluride (HgZnTe, MZT) is an alloy of mercury telluride and zinc telluride. It is used in infrared detectors and arrays for infrared imaging and infrared astronomy.

It should be noted that radiation detectors formed in accordance with various embodiments described herein may be used, for example, in imaging systems to reconstruct or render an image. However, the term "reconstructing" or "rendering" an image or data set is not intended to exclude embodiments in which data representing an image is generated, but a viewable image is not. Therefore, when used, "image" or "imaging" broadly refers to both viewable images and data representing a viewable image that may be generated from data acquired by a radiation detector of one or more embodiments.

EXAMPLES

Materials:
CdTe family crystals were grown by the Bridgman method. They were polished using 400, 800 and 1200 grid polishing pads followed by 1μ alumina slurry.

CZT surface oxidation was done by submerging the CZT crystal in $H_2O_2$ solution at 40 to 80° C. for 5 to 50 minutes, then rinsed with deionized (DI) water.

$Al_2O_3$ films were deposited by atomic layer deposition (ALD) at temperature of 250° C. The films were grown using distilled $H_2O$ and $Al(CH_3)_3$ [trimethylaluminum (TMA)]. The carrier gas in the flow reactor was $N_2$. 100 cycles of TMA and $H_2O$ injections were made to obtain the $Al_2O_3$ layer.

Testing:

The photon counting tests were done with the x-ray flux at 140 kVp/6 mA (input count rate flux=25 ($\times 10^6$) X-ray/s/mm$^2$) and 10 msec of integration time. Bias voltage of 1200 V was applied across the device. FIG. 3 shows a comparison of normalized standard deviation in measurement of a signal for a device comprising a CZT semiconductor having an Al$_2$O$_3$ passivation layer and a device comprising a CZT semiconductor having an oxidized surface (Control). As seen in FIG. 3, the Al$_2$O$_3$ passivated device shows lower normalized standard deviation (i.e., improved signal to noise ratio) compared to the control.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A photon counting device comprising:
    a direct mode detector comprising;
    a CdMgTeSe semiconductor layer located between a cathode electrode and an anode electrode; and a metal oxide layer comprising a metal oxide, wherein
    the metal oxide comprises a metal that is different from metals present in the CdMgTeSe semiconductor layer.

2. The photon counting device of claim 1, wherein the metal oxide layer is located between the cathode electrode and the CdMgTeSe semiconductor layer.

3. The photon counting device of claim 1, wherein the metal oxide layer comprises Al$_2$O$_3$.

4. The photon counting device of claim 1, wherein the thickness of the metal oxide layer ranges from about 0.1 nm to about 3 nm.

5. The photon counting device of claim 1, wherein the metal oxide layer reduces passage of leakage current.

6. The photon counting device of claim 1, wherein a surface of the CdMgTeSe semiconductor layer comprises a pre-existing oxide and the metal oxide layer is disposed on the pre-existing oxide.

7. The photon counting device of claim 6, wherein the pre-existing oxide comprises metals which are the same as the metals present in the CdMgTeSe semiconductor.

8. An X-ray imaging device comprising a detector according to claim 1.

9. A direct mode radiation detector comprising a CdMgTeSe semiconductor layer located between a cathode electrode and an anode electrode.

10. The direct mode radiation detector of claim 9, additionally comprising a metal oxide layer, wherein the metal oxide is selected from the group consisting of aluminum oxide (Al$_2$O$_3$), gallium oxide (Ga$_2$O$_3$), hafnium oxide (HfO$_2$), zirconium oxide (ZrO$_2$), magnesium oxide (MgO), and combinations thereof.

11. The direct mode radiation detector of claim 10, wherein the metal oxide layer comprises Al$_2$O$_3$.

12. The direct mode radiation detector of claim 10, wherein the thickness of the metal oxide layer ranges from about 0.1 nm to about 3 nm.

13. A method for fabricating a direct mode detector comprising a CdMgTeSe semiconductor layer, the method comprising depositing a metal oxide layer comprising a metal oxide, between a cathode electrode and the semiconductor layer of an X-ray detector, wherein the metal oxide comprises a metal that is different from metals present in the CdMgTeSe semiconductor layer; and a thickness of the metal oxide layer ranges from about 0.1 nm to about 5 nm.

14. The method of claim 13, wherein the metal oxide layer comprises Al$_2$O$_3$.

15. The method of claim 13, wherein the metal oxide layer is deposited by atomic layer deposition.

16. The method of claim 13, wherein the metal oxide layer reduces passage of leakage current.

* * * * *